United States Patent
Ochi et al.

(10) Patent No.: US 7,268,417 B2
(45) Date of Patent: Sep. 11, 2007

(54) CARD-TYPE CIRCUIT DEVICE

(75) Inventors: Takao Ochi, Shiga (JP); Takashi Takata, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/420,985

(22) Filed: Apr. 22, 2003

(65) Prior Publication Data

US 2003/0227025 A1    Dec. 11, 2003

(30) Foreign Application Priority Data

Apr. 26, 2002 (JP) ............................. 2002-126826
Apr. 16, 2003 (JP) ............................. 2003-111702

(51) Int. Cl.
*H01L 23/02* (2006.01)
*H01L 23/48* (2006.01)

(52) U.S. Cl. ..................... 257/679; 257/688; 257/689; 257/730

(58) Field of Classification Search ........ 257/678–680, 257/688–689, 701–705, 729–733
See application file for complete search history.

(56) References Cited

FOREIGN PATENT DOCUMENTS

| JP | 7-321438 | 12/1995 |
|----|----------|---------|
| JP | 9-162208 | 6/1997 |
| JP | 10-92968 | 4/1998 |

*Primary Examiner*—Ori Nadav
(74) *Attorney, Agent, or Firm*—Hamre, Schumann, Mueller & Larson, P.C.

(57) ABSTRACT

A electronic circuit device is provided with an electronic component provided with an electrode, a substrate having an upper surface on which the electronic component is mounted, external electrode that is formed near the electronic component mounted on the upper surface of the substrate and that is connected to the electrode, an insulating protrusion that is provided across the upper surface of the external electrode, and a sealing resin that seals the electronic component without covering the external electrode. The upper surface of the external electrode is partitioned by the protrusion into a first area that is located on the sealing resin side and a second area that is located the side opposite to the first area. The adherence of fine particles such as flakes of the sealing resin to the external electrode is suppressed, so that a stable electric connection between the external electrode and the electric equipment can be maintained.

11 Claims, 4 Drawing Sheets

CARD-TYPE CIRCUIT DEVICE

BACKGROUND OF THE INVENTION

1. Field of the Invention

The present invention relates to electronic circuit devices in which electronic circuits such as a semiconductor memory for storing various data, operation methods, and the like are mounted on card-type or TAG-type substrates.

2. Description of the Related Art

As an example of a card-type electronic circuit device, conventionally, a semiconductor device in which a semiconductor chip is mounted on a card-type substrate is well known. Widespread use of a system in which card-type electronic circuit devices are attached to various kinds of electronic equipment, and data input/output is performed between a semiconductor chip and electronic equipment, is desired. For example, in the distribution industry, the transport industry, or the like, in order to control information of individual articles to be handled, a system is employed in which a card-type semiconductor device is attached to the article itself or the article box, and data, operation methods, and the like that are stored in the device are read by a card reader.

FIGS. 5 to 8 are diagrams showing conventional card-type semiconductor devices. FIG. 5 is a plan view showing the outer appearance of a first configuration of a conventional semiconductor device, and FIG. 6 is a cross-sectional view taken along line C-C1 in FIG. 5. FIG. 7 is a plan view of a second configuration of a conventional semiconductor device, and FIG. 8 is a cross-sectional view taken along line D-D1 in FIG. 7.

First, the first configuration of the conventional semiconductor device will be described. As shown in FIGS. 5 and 6, a card-type semiconductor device 4 is made by mounting a semiconductor package 2 containing a semiconductor chip (not shown) such as a memory chip inside an outer packaging case 1 on a substrate 1. By inserting this card-type semiconductor device 4 into various kinds of electronic equipment (not shown), or by passing an article or the like on which the card-type semiconductor device 4 is attached through a card reader, input/output terminals of the electronic equipment or the card reader unit come into contact with external electrodes 5 of the card-type semiconductor device 4. Thus, data input/output between the electronic equipment and the semiconductor chip mounted on the semiconductor device 4 is performed. Accordingly, by repeatedly inserting and retrieving the card-type semiconductor device 4 into and from a series of electronic equipment to perform data input/output, or by passing the card-type semiconductor devices 4 that are attached to articles or boxes for transporting articles, through a card reader, the physical distribution data of the articles that are transported can be sequentially stored and controlled.

Next, a second configuration of a conventional semiconductor device will be described. Currently, in accordance with the trend toward compact, lightweight, and portable electronic equipment, the demand for compact, light and thin card-type semiconductor devices are increasing. To address this need, bare chip mounted card-type semiconductor devices, in which a semiconductor chip is bare-chip mounted on a substrate, are desired. In addition, in accordance with the demands of the market for low cost card-type semiconductor devices, a configuration without an outer packaging case contributes to reducing the material cost and manufacturing cost. At the same time, even smaller, lighter and thinner card-type semiconductor devices are desired.

Examples of card-type semiconductor device are described in Japanese Laid-Open Patent Publications (Tokkai) No. 9-162208, 10-92968, or 7-321438.

In these cases, for example, as shown in FIGS. 7 and 8, a semiconductor chip 8 is bare-chip mounted on a substrate 6 through a die bond material 7. Electric connectors 10 are formed on one end of conductor lines 9 formed on the substrate 6. The electric connectors 10 and electrodes 12 on the semiconductor chip 8 are connected by metal wires 13. External electrodes 14 are formed on the other end of the conductor lines 9. A solder resist 15 enclosing the semiconductor chip 8 is applied on the surface of the substrate 6 except at the external electrodes 14 and the electric connectors 10, and the semiconductor chip 8, the metal wires 13, and the electric connectors 10 are covered with a sealing resin 16.

However, in the conventional semiconductor device in FIGS. 7 and 8, when the portion on which the external electrodes 14 are formed is inserted into the electronic equipment, the portion of the sealing resin 16 may come into contact with the portion of the electronic equipment into which it is inserted. Thus, a portion of the sealing resin 16 may be shaved off, and fine particles of the sealing resin 16 tend to be generated. As a result, these fine particles of the sealing resin 16 adhere to the external electrodes 14. This caused the problem that insufficient electrical connection between the electronic equipment and the semiconductor device is attained.

If the semiconductor device is inserted into the electronic equipment in a state in which fine particles of the sealing resin 16 adhere to the external electrodes 14 of the semiconductor device, then the fine particles of the sealing resin 16 may damage the external electrodes 14 of the semiconductor device, impeding the electrical connection between the semiconductor device and the electronic equipment.

The above problem arises not only in a card-type semiconductor device equipped with a semiconductor chip, but is common to all type electronic circuit devices having a configuration in which electronic circuits and external terminals are provided on a substrate of a card-type, TAG-type, etc., and the electronic circuit portion is sealed by a resin.

SUMMARY OF THE INVENTION

Therefore, with the foregoing in mind, it is an object of the present invention to provide an electronic circuit device in which, when using the electronic circuit device by inserting it repeatedly into an electronic equipment, fine particles of a sealing resin that are generated when the electronic circuit device is inserted into the electronic equipment are eliminated promptly, and a stable electrical connection between the electronic circuit device and the electronic equipment can be maintained.

In order to solve the above conventional problems, an electronic circuit device according to the present invention includes an electronic component provided with an electrode, a substrate having an upper surface on which the electronic component is mounted, an external electrode that is formed on the upper surface of the substrate and connected to the electrode, an insulating protrusion that is provided across the upper surface of the external electrode, and a sealing resin that seals the electronic component without covering the external electrode. The upper surface of the external electrode is partitioned by the protrusion into a first area that is located on the sealing resin side and a second area that is located on the side opposite to the first area.

DESCRIPTION OF THE PREFERRED EMBODIMENTS

Figure 1:
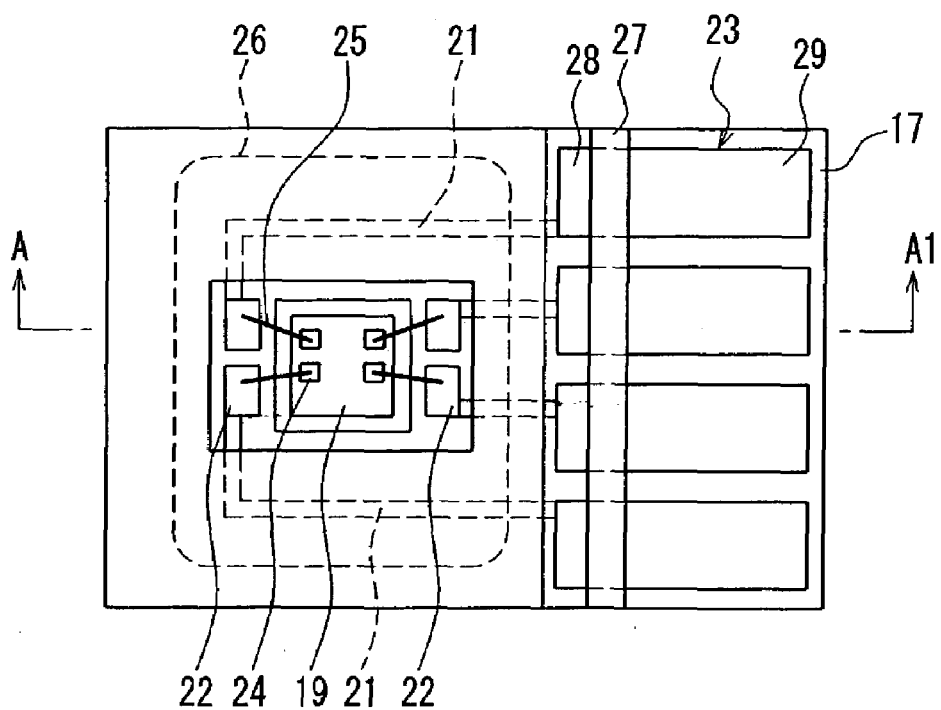
FIG. 1 is a plan view showing a card-type semiconductor device according to a first embodiment of the present invention.

According to the electronic circuit device having the configuration described above, if fine particles such as flakes of a sealing resin are generated through contact between the sealing resin and an insertion part of electronic equipment when an external electrode is inserted into the electronic equipment, the fine particles are blocked by the protrusion, suppressing the ability of the fine particles reaching and adhering to the second area on the external electrode. Thus, a stable electrical connection between the electronic equipment and the external electrode can be maintained. In addition, a first area of the external electrode is located between the protrusion and the sealing resin, so that when the fine particles of the sealing resin adhere to the surface of the first area, the presence of the fine particles easily can be recognized by differences in the color tone, luster, or the like of the surface of the external electrode and the fine particles of the sealing resin. The electronic component is not necessarily mounted as one body. Instead, a plurality of electronic components or a plural kinds of electronic components may be mounted in the electronic circuit device according to an embodiment of the invention.

It is preferable that the height of the protrusion is at least 10 µm. Thus, the probability is high that the fine particles of the sealing resin will be smaller in size than the height of the protrusion. Accordingly, when the card-type electronic circuit device is stacked on another card-type electronic circuit device, few fine particles of the sealing resin are pressed into the external electrodes, and damage to the external electrodes is avoided.

It is possible to adopt a configuration in which a plurality of protrusions are formed in an area ranging from the end on the sealing resin side of the external electrode to the end on the substrate outer edge side of the external electrode.

It is also possible to adopt a configuration in which a slit is formed in an area of the substrate between the sealing resin and the protrusion. When a plurality of protrusions are formed, a slit may be formed in an area of the substrate between the sealing resin and the protrusion that is closest to the sealing resin. Due to the slit, many of the fine particles such as flakes of the sealing resin drop into the slit, so that adhering or depositing of the fine particles on the external electrode can be avoided. In the above mentioned configuration, in which single protrusion or a plurality of protrusions are formed, a plurality of slits may be provided. The slits may be disposed at any appropriate locations with respect to the protrusion.

In the electronic circuit device of the above-described configuration, it is possible to form a second protrusion on the upper surface of the end portion of the external electrodes on the side of the sealing resin, or on the upper surface of the substrate adjacent to the end portion, and to form a slit in an area of the substrate between the sealing resin and the second protrusion.

The protrusion can be made of a solder resist, a painting material, or a screen printing material. Thus, the protrusion can be made of simple materials and made by a simple manufacturing process, which is generally employed to make printed boards, at low cost. It is preferable that the protrusion is formed by photolithography, using a solder resist. With the protrusion formed by photolithography, upper edges in the cross section will be relatively sharp-angled, so that the effect of rejecting the fine particles of the sealing resin is high.

It is possible to adopt a configuration in which a plurality of external electrodes are formed and the protrusion is formed in a straight line across the plurality of external electrodes. Thus, the fine particles of the sealing resin, which adhere between the sealing resin and the external electrodes, can be eliminated easily by using a brush or the like.

As an electronic component, a semiconductor chip can be mounted.

Hereinafter, as an embodiment of a card-type electronic circuit device according to the present invention, a contact-type card-type semiconductor device will be described with reference to drawings.

First Embodiment

Figure 2:
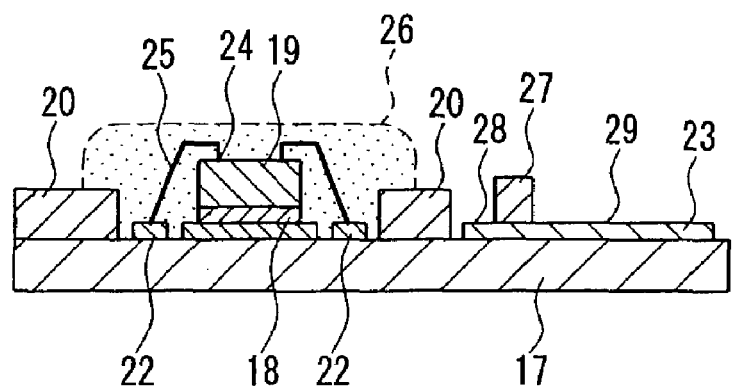
FIG. 2 is a cross-sectional view taken along line A-A1 in FIG. 1.

FIG. 1 is a plan view showing a card-type semiconductor device according to a first embodiment, and FIG. 2 is a cross-sectional view taken along line A-A1 in FIG. 1.

As shown in FIGS. 1 and 2, the back side of a semiconductor chip 19 is bonded on a substrate 17 made of a resin or a ceramic through a die bond material 18. A layer of a solder resist 20 is formed surrounding the area on which the semiconductor chip 19 is bonded. On the substrate 17, a plurality of conductor lines 21 are further formed. Electric connectors 22 are formed on one end of the conductor lines 21, and external electrodes 23 are formed on the other end of the conductor lines 21. All external electrodes 23 are disposed along one side of the substrate 17. Electrodes 24 on the semiconductor chip 19 and the electric connectors 22 are electrically connected by metal wires 25. On the substrate 17, the semiconductor chip 19, metal wires 25, and the electric connectors 22 are sealed by a sealing resin 26 that is made of an epoxy resin. Here, the sealing resin 26 is formed such that a portion of it also is applied to the layer of the solder resist 20.

The external electrodes 23 are not sealed by the sealing resin 26. A stripe-shaped protrusion 27 that is formed by a resin made of a solder resist or a silk printing material is formed in a straight line on the substrate 17 across the plurality of external electrodes 23. Thus, the upper surface of the external electrodes 23 is partitioned into a first area 28 that is located between the sealing resin 26 and the protrusion 27 and a second area 29 that is located on the opposite side of the first area 28 across the protrusion 27. Within the external electrodes 23, the second area 29 serves as an electrical connection to the electronic equipment, such as an external reader/writer. This connection is made, for example, by inserting the semiconductor device into the electronic equipment. Considering the connection with the electronic equipment, it is preferable that the length of the second area 29 is the same as that of conventional external electrodes, but there is no limitation to this. The stripe-shaped protrusion 27 is not necessarily straight and capable of having a bent portion.

In this card-type semiconductor device, even if fine particles such as flakes of the sealing resin 26 are generated while inserting the semiconductor device into the electronic equipment, the fine particles are trapped in the first area 28 between the sealing resin 26 and the protrusion 27. Accordingly, the fine particles of the sealing resin 26 do not reach the second area 29 of the external electrodes 23, which is the portion electrically connecting the semiconductor device and the electronic equipment. As a result, a stable electric connection between the semiconductor chip in the semiconductor device and the electronic equipment can be achieved, even if fine particles such as flakes of the sealing resin are generated through contact between the sealing resin and the equipment or the like, when the card-type semiconductor device according to the present embodiment is inserted into the electronic equipment or the like, or when it is attached to an article of a transport cargo to control its physical distribution.

In addition, the surface luster and the color gradation of the fine particles of the sealing resin 26 differ from that of the external electrodes 23, which are made of a metal such as copper, so that the presence of the fine particles that have adhered to the first area 28 of the external electrodes 23 can be verified easily. Thus, The time to clean the surface of the external electrodes 23 can be determined. Similarly, when the sealing resin 26 is filled, it can be verified easily when the resin overflows to the first area 28 of the external electrodes 23. Thus, the amount of filling resin can be adjusted easily.

In addition, the protrusion 27 is formed across the plurality of external electrodes 23 in a straight line, so that fine particles of the sealing resin 26 that adhere to the first area 28 of the external electrodes 23 can be eliminated easily with a brush.

Further, the protrusion 27 is formed on the upper surface of the external electrodes 23, and the height of the protrusion 27 is set to a size of more than the diameter of the fine particles of the sealing resin 26, so that even when the fine particles of the sealing resin 26 adhere to the surface of the external electrodes 23, damage to the surface of the external electrodes 23 can be suppressed, because if another substrate 17 or another card-type semiconductor device are stacked on the card-type semiconductor device during the manufacturing process of the substrate 17 or during the assembly process of the card-type semiconductor device, the fine particles of the sealing resin 26 adhering to the surface of the external electrodes 23 are not pressed into the external electrodes 23. In order to obtain this effect, the height of the protrusion 27 is set to at least 10 µm, and preferably at least 20 µm. If an upper limit on the height is set based on the constraints of the process of forming the protrusion 27, it generally may be set to 500 µm.

In addition, it is preferable that the protrusion 27 is formed by photolithography, using a solder resist. With a protrusion 27 formed by photolithography, upper edges in the cross section will be relatively sharp-angled and edges of an approximately 90° angle are obtained, so that the effect of rejecting the fine particles of the sealing resin 26 becomes high.

Moreover, the length of the external electrodes 23 is made longer by forming the first area 28 on the substrate 17 in addition to the second area 19, so that the length of the portion on which the conductor lines 21, whose width is smaller than that of the external electrodes 23, are formed becomes short. Accordingly, the stress applied on the conductor lines 21 when bending the substrate 17 becomes small, so that breaking of the conductor lines 21 can be avoided.

Here, in the card-type semiconductor device described above, the semiconductor chip 19 and the electric connectors 22 are connected by the metal wires 25. However, they also may be connected directly by protrusion electrodes.

Second Embodiment

Figure 3:
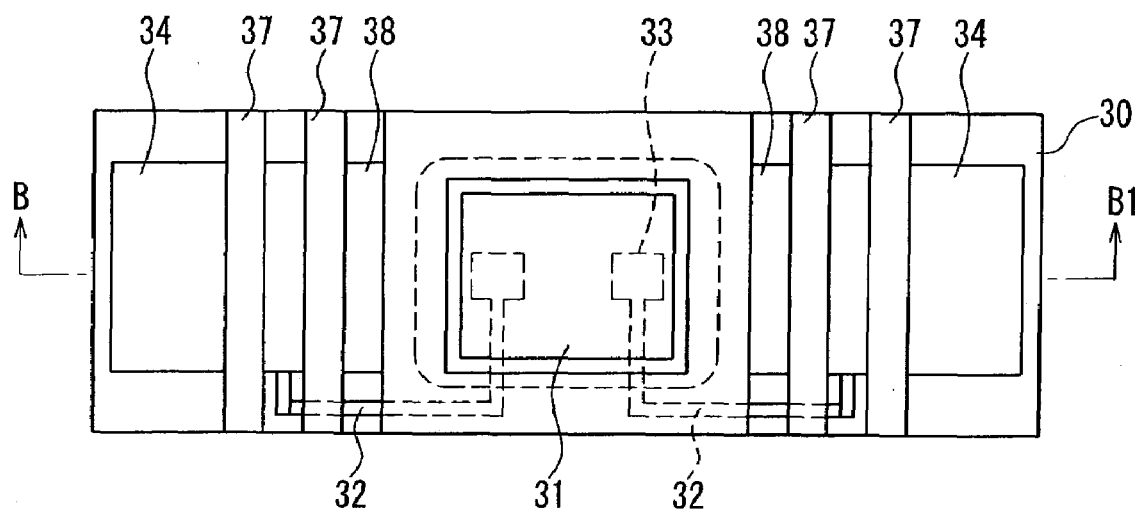
FIG. 3 is a plan view showing a card-type semiconductor device according to a second embodiment of the present invention.
Figure 4:
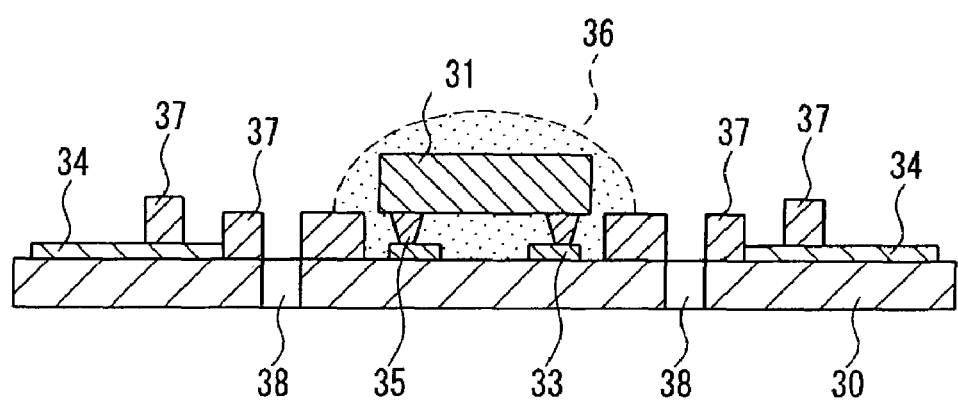
FIG. 4 is a cross-sectional view taken along line B-B1 in FIG. 3.
Figure 5:
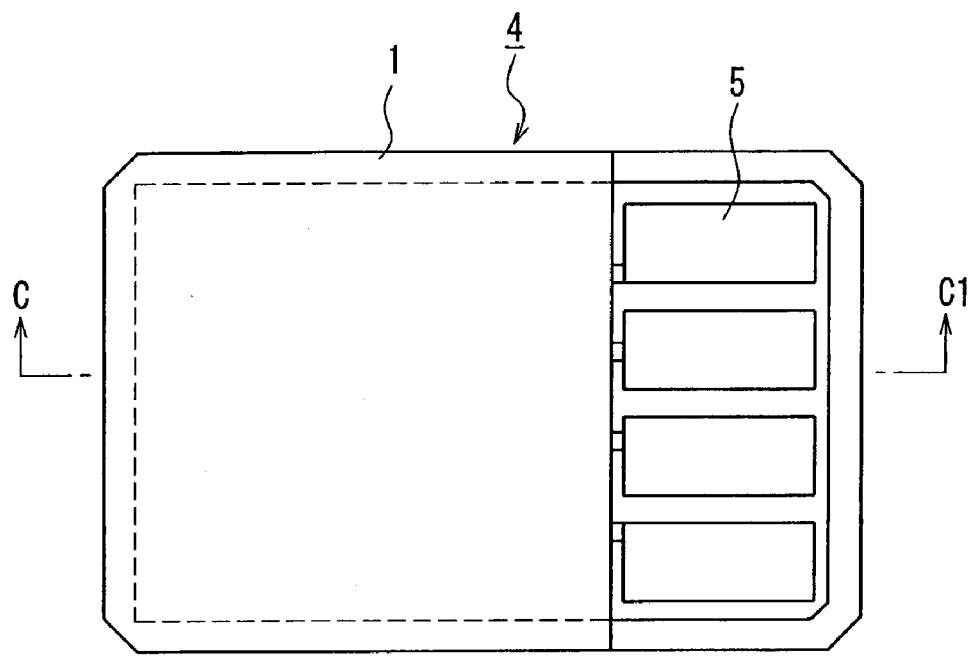
FIG. 5 is a plan view showing a conventional card-type semiconductor device.
Figure 6:
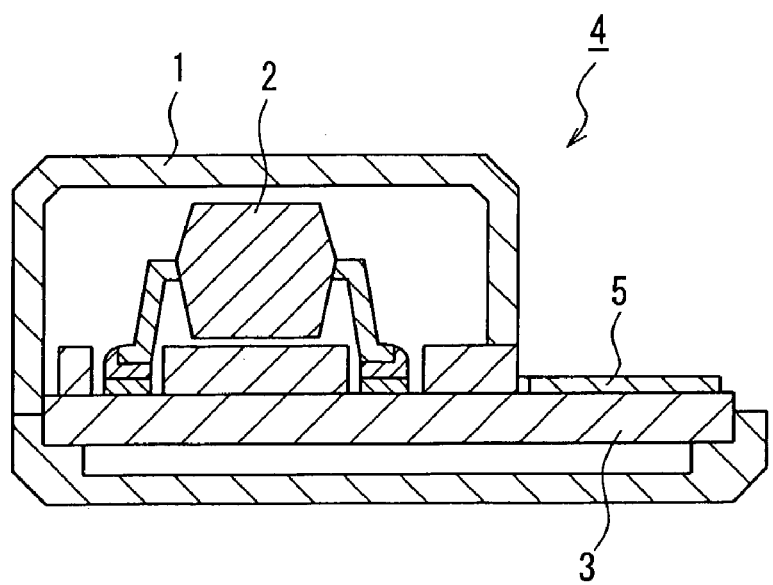
FIG. 6 is a cross-sectional view taken along line C-C1 in FIG. 5.
Figure 7:
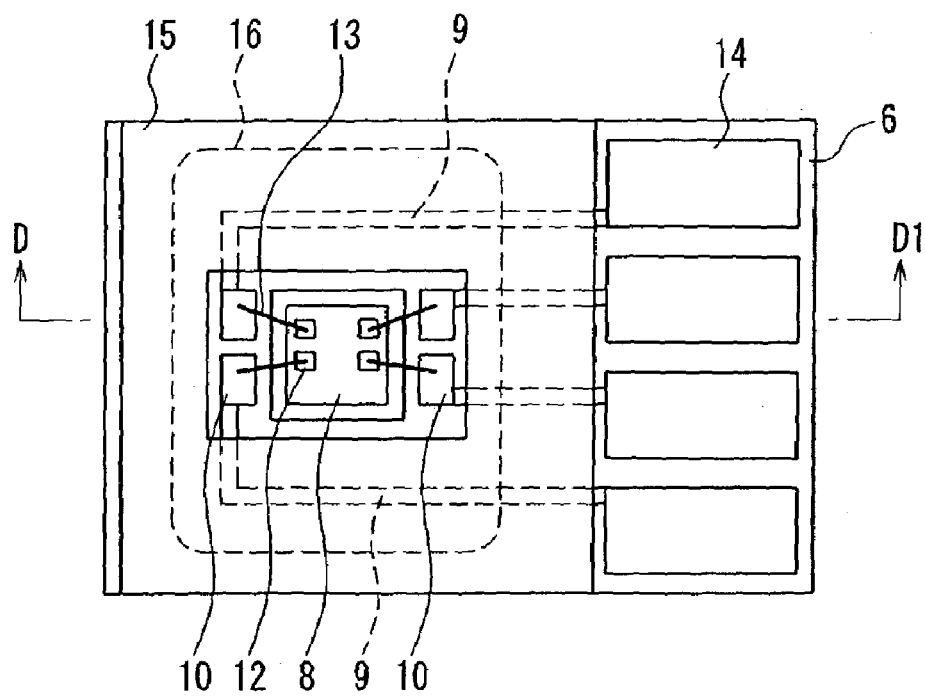
FIG. 7 is a plan view showing another configuration of a conventional card-type semiconductor device.
Figure 8:
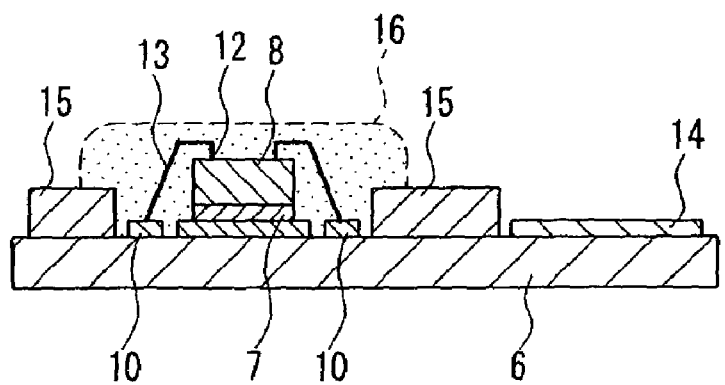
FIG. 8 is a cross-sectional view taken along line D-D1 in FIG. 5.

FIG. 3 is a plan view showing a semiconductor device according to a second embodiment, and FIG. 4 is a cross-sectional view taken along line B-B1 in FIG. 3.

As shown in FIGS. 3 and 4, a semiconductor chip 31 is flip-chip mounted on a rectangular substrate 30 near the center thereof. Conductor lines 32 are formed on the substrate 30. Electric connectors 33 are formed on one end of the conductor lines 32, and external electrodes 34 are formed on the other end of the conductor lines 32. Electrodes of the semiconductor chip 31 and the electric connectors 33 are connected by protrusion electrodes 35. A layer of solder resist encloses the area to which the semiconductor chip 31 is bonded. The semiconductor chip 31, the metal wires 25, and electric connectors 33 are sealed by a sealing resin 36. Here, the sealing resin 26 is formed such that a portion of it is also applied to the layer of the solder resist 20.

On the substrate 30, a plurality of protrusions 37 are provided, some of which are formed across the external electrodes 34. Between the protrusions 37 that are closest to the sealing resin 36 and the sealing resin 36, slits 38 are provided that have a width equal to or more than the width of the external electrodes 34 and that pass through the substrate 30. As described above, the plurality of protrusions 37 are formed from the end of the sealing resin 36 side of the external electrodes 34 to the end of the outer edge side of the substrate 30, and the slits 38 are formed on the areas of the substrate 30 between the sealing resin 36 and the protrusions 37 that are closest to the sealing resin 36. The protrusions that are closest to the sealing resin 36 have been shown to traverse the upper surface of an end of the external electrodes 34, but they may also be on the substrate 30 adjacent to the end of the outer electrodes 34.

In the card-type semiconductor device having this configuration, if fine particles such as flakes of the sealing resin 36 are generated when it is inserted into and retrieved from the electronic equipment, the fine particles of the sealing resin 36 are obstructed from moving by the protrusions 37, and they further drop into the slits 38. Thus, the fine particles do not adhere or deposit to the external electrodes 37, and favorable electrical contact between the electric equipment and the external electrodes 34 can be maintained. In addition, if the fine particles of the sealing resin 36 go beyond the slits 38, they are trapped in valleys that are formed by two protrusions 37, so that they do not adhere to the second area of the external electrodes 34.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A card-type electronic circuit device comprising:
an electronic component provided with a plurality of electrodes;
a card-type substrate having an upper surface on which the electronic component is mounted;
a plurality of electronic connectors disposed on the upper surface of the substrate and connected to the respective electrodes of the electronic component;
a plurality of external electrodes disposed on the upper surface of the substrate along one of outer edges of the substrate and connected to the respective electric connectors through respective conductor lines;
a solder resist formed on the upper surface of the substrate except for the area in which the external electrodes are provided, the solder resist surrounding the area in which the electronic component end the electric connectors are disposed, with an opening being formed above the electronic component end the electric connectors;
a sealing resin that seals the electronic component and the electric connectors without covering the external electrodes, the sealing resin extending on an inner peripheral part of the solder resist; and
an insulating protrusion that is provided across an upper surface of each external electrode and arranged between the sealing resin and the one outer edge of the substrate;
wherein the upper surfaces of the external electrodes are partitioned by the protrusion into a first area that is located on the sealing resin side and a second area that is located on the side opposite to the first area, with an upper surface of both of the first and second areas being exposed without being covered with the sealing resin.

2. The card-type electronic circuit device according to claim 1, wherein a height of the protrusion is at least 10 μm.

3. The card-type electronic circuit device according to claim 1, wherein the protrusion is made of a solder resist, a painting material, or a screen printing material.

4. The card-type electronic circuit device according to claim 1, wherein the protrusion is formed in the shape of a straight line.

5. The card-type electronic circuit device according to claim 1, wherein the electric component is a semiconductor chip, and the substrate is card-shaped.

6. A card-type electronic circuit device comprising:
an electronic component provided with a plurality of electrodes;
a card-type substrate having an upper surface on which the electronic component is mounted;
a plurality of electronic connectors disposed on the upper surface of the substrate and connected to the respective electrodes of the electronic component;
a plurality of external electrodes disposed on the upper surface of the substrate along an opposite pair of outer edges of the substrate and connected to the respective electric connectors through respective conductor lines;
a solder resist formed on the upper surface of the substrate except for the area in which the external electrodes are provided, the solder resist surrounding the area in which the electronic component and the electric connectors are disposed, with an opening being formed above the electronic component and the electric connectors;
a sealing resin that seals the electronic component and the electric connectors without covering the external electrodes, the sealing resin extending on an inner peripheral part of the solder resist; and
an insulating protrusion that is provided across an upper surface of each external electrode disposed along the respective outer edges of the substrate and arranged between the sealing resin and the respective outer edges of the substrate,
wherein the upper surfaces of the external electrodes are partitioned by the protrusion into a first area that is located on the sealing resin side and a second area that is located on the side opposite to the first area, with an upper surface of both of the first and second areas being exposed without being covered with the sealing resin.

7. The card-type electronic circuit device according to claim 6, wherein a plurality of protrusions are formed in an area ranging from the end on the sealing resin side of the external electrode to the end on the substrate outer edge side of the external electrode.

8. The card-type electronic circuit device according to claim 7, wherein the protrusion is made of a solder resist, a painting material, or a screen printing material.

9. The card-type electronic circuit device according to claim 6, wherein a slit is formed in an area of the substrate between the sealing resin and the protrusion.

10. The card-type electronic circuit device according to claim 6, wherein a slit is formed in an area of the substrate between the sealing resin and the protrusion that is closest to the sealing resin.

11. The card-type electronic circuit device according to claim 6, wherein a second protrusion is formed on the upper surface of an end portion of the external electrode on the side of the sealing resin, or on the upper surface of the substrate adjacent to the end portion, and a slit is formed in an area of the substrate between the sealing resin and the second protrusion.

* * * * *